US009232628B2

(12) United States Patent
Radovanov et al.

(10) Patent No.: US 9,232,628 B2
(45) Date of Patent: Jan. 5, 2016

(54) METHOD AND SYSTEM FOR PLASMA-ASSISTED ION BEAM PROCESSING

(71) Applicant: Varian Semiconductor Equipment Associates, Inc., Gloucester, MA (US)

(72) Inventors: Svetlana B. Radovanov, Brookline, MA (US); Ludovic Godet, Boston, MA (US); Bon-Woong Koo, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 213 days.

(21) Appl. No.: 13/771,428

(22) Filed: Feb. 20, 2013

(65) Prior Publication Data

US 2014/0234554 A1    Aug. 21, 2014

(51) Int. Cl.
| | |
|---|---|
| *H01L 21/00* | (2006.01) |
| *C23C 16/00* | (2006.01) |
| *H05H 3/00* | (2006.01) |
| *C23C 16/452* | (2006.01) |
| *H01J 37/32* | (2006.01) |
| *C23C 16/04* | (2006.01) |
| *C23C 16/507* | (2006.01) |

(52) U.S. Cl.
CPC ............... *H05H 3/00* (2013.01); *C23C 16/045* (2013.01); *C23C 16/452* (2013.01); *C23C 16/507* (2013.01); *H01J 37/32146* (2013.01); *H01J 37/32357* (2013.01); *H01J 37/32412* (2013.01); *H01J 37/32706* (2013.01)

(58) Field of Classification Search
CPC ............ H01J 37/3171; H01J 37/32357; H01J 37/32422; H01J 37/32633; H01J 37/32651; H01J 37/32697; H01J 37/32788

USPC ............... 118/723 R, 723 I, 723 IR, 723 AN; 156/345.35, 345.39, 345.4, 345.48, 156/345.49; 315/111.31

See application file for complete search history.

(56) References Cited

U.S. PATENT DOCUMENTS

| | | |
|---|---|---|
| 3,904,505 A | 9/1975 | Aisenberg |
| 4,977,352 A | 12/1990 | Williamson |

(Continued)

FOREIGN PATENT DOCUMENTS

DE    19929278 A1    2/2000

OTHER PUBLICATIONS

International Search Report and Written Opinion mailed May 6, 2014 for PCT/US2014/017053 filed Feb. 19, 2014.

*Primary Examiner* — Luz Alejandro Mulero (57) ABSTRACT

A system for processing a substrate may include a first chamber operative to define a first plasma and a second chamber adjacent the first chamber, where the second chamber is electrically isolated from the first chamber, and configured to define a second plasma. The system may also include an extraction assembly disposed between the first chamber and second chamber to provide at least plasma isolation between the first plasma and the second plasma, a substrate assembly configured to support the substrate in the second chamber; and a biasing system configured to supply a plurality of first voltage pulses to direct first ions from the first plasma through the second chamber towards the substrate during one time period, and to supply a plurality of second voltage pulses to generate the second plasma and to attract second ions from the second plasma during another time period.

11 Claims, 7 Drawing Sheets

(56) References Cited

U.S. PATENT DOCUMENTS

| | | | |
|---|---|---|---|
| 5,900,062 A * | 5/1999 | Loewenhardt et al. | 118/723 R |
| 5,942,039 A * | 8/1999 | Kholodenko et al. | 118/723 E |
| 6,335,535 B1 * | 1/2002 | Miyake et al. | 250/492.21 |
| 7,421,973 B2 | 9/2008 | Kellerman et al. | |
| 7,767,561 B2 | 8/2010 | Hanawa et al. | |
| 7,767,977 B1 | 8/2010 | Godet et al. | |
| 8,188,445 B2 | 5/2012 | Godet et al. | |
| 8,288,741 B1 | 10/2012 | Miller et al. | |
| 2006/0102286 A1 * | 5/2006 | Kim | 156/345.35 |
| 2008/0193673 A1 * | 8/2008 | Paterson et al. | 427/569 |
| 2009/0001890 A1 | 1/2009 | Singh et al. | |
| 2009/0142930 A1 * | 6/2009 | Hammond et al. | 438/711 |
| 2009/0236314 A1 * | 9/2009 | Chen | 216/67 |
| 2011/0124186 A1 | 5/2011 | Renau et al. | |
| 2011/0223546 A1 | 9/2011 | Godet et al. | |
| 2011/0256732 A1 | 10/2011 | Maynard et al. | |
| 2012/0228515 A1 | 9/2012 | Leavitt et al. | |
| 2013/0287963 A1 | 10/2013 | Radovanov et al. | |

\* cited by examiner

METHOD AND SYSTEM FOR PLASMA-ASSISTED ION BEAM PROCESSING

BACKGROUND OF THE INVENTION

1. Field of the Invention

Embodiments of the invention relate to the field of device processing. More particularly, the present invention relates to a method, system and structure for patterning a substrate.

2. Discussion of Related Art

Conventional plasma doping systems (PLAD) are employed to perform both ion implantation as well as thin film deposition on a substrate. However, the ability to coat three dimensional structures (3-D) faces challenges using conventional PLAD technology. In particular, conformal coating may be difficult to achieve. When used as a deposition tool, previous work has demonstrated that high quality layers may be deposited upon 3-D structures such as trenches that are disposed in a substrate surface region. However, in order to achieve 3-D doping of 3-D structures, such as fin type field effect transistors (FinFET) control of the angular distribution of knock-on ions that may be used to produce high quality layers is desirable. In conventional PLAD, the angle of incidence of knock-on ions that may impinge upon the substrate is typically close to perpendicular to a plane of the substrate such that vertical and other surfaces inclined at an angle with respect to the substrate plane receive ions at a different relative angle as compared to surfaces that are parallel to the substrate plane. Accordingly, uniform exposure of all surfaces of a 3-D structure to knock on ions in a PLAD system is not generally achieved.

This problem may be addressed by performing a separate ion treatment procedure in a different apparatus that provides ions over a range of angles of incidence, such as a tool having a plasma sheath modifier. More uniform coverage of 3-D structures may then be achieved, with the drawback that the process requires separate tools to achieve the desired result for coatings of 3-D structures. In view of the above, it will be appreciated that there is a need to develop less complex and costly methods for treating 3-D structures on a substrate surface.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Embodiments of the present disclosure are directed to systems methods for improving ion treatment of 3-D structures in a substrate. In one embodiment, a system for processing a substrate includes a first chamber operative to define first plasma and a second chamber adjacent the first chamber, where the second chamber is electrically isolated from the first chamber, and configured to define second plasma. The system may also include an extraction assembly disposed between the first chamber and second chamber to provide at least plasma isolation between the first plasma and the second plasma, a substrate assembly configured to support the substrate in the second chamber; and a biasing system configured to supply a plurality of first voltage pulses to direct first ions from the first plasma through the second chamber towards the substrate during one time period, and to supply a plurality of second voltage pulses to generate the second plasma and to attract second ions from the second plasma during another time period.

In another embodiment, a method for processing a substrate includes generating a first plasma in a first chamber, supplying a plurality of first voltage pulses to the first chamber, the first voltage pulses configured to direct first ions from the first plasma toward the substrate, and supplying a plurality of second voltage pulses to the substrate, the second voltage pulses configured to generate a second plasma in a second chamber as a series of plasma pulses and to attract second ions from the second plasma.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

In present day fabrication of devices, many a substrate may be exposed to ions during multiple different processes. In accordance with the present embodiments, a multi-chamber processing system is provided to perform multiple different ion treatments of a substrate in a manner not achieved by conventional apparatus.

In various embodiments, a system or apparatus may provide plasma assisted ion beam processing. In particular embodiments, the system includes an ion source to generate an ion beam, an extraction system to extract the ion beam, a plasma source to generate a plasma independently of the ion source that generates the ion beam. A substrate stage or assembly may be arranged in the system to support a substrate such that the substrate can be exposed to the ion beam and plasma either concurrently, or in alternating fashion.

As detailed below, advantages afforded by the present embodiments include independent control of deposition related ion processes and knock-on type ion processes, including independent control of ion dose and ion energy between different processes. Other advantages include the ability to control the distribution of angles of incidence of ions directed toward the substrate, both at the extraction point where ions are extracted from the ion source and where ions impinge upon the substrate plane. Moreover, ions extracted from the ion source may be used to modulate plasma parameters in the plasma source, thereby enabling ion dose control.

Figure 1:
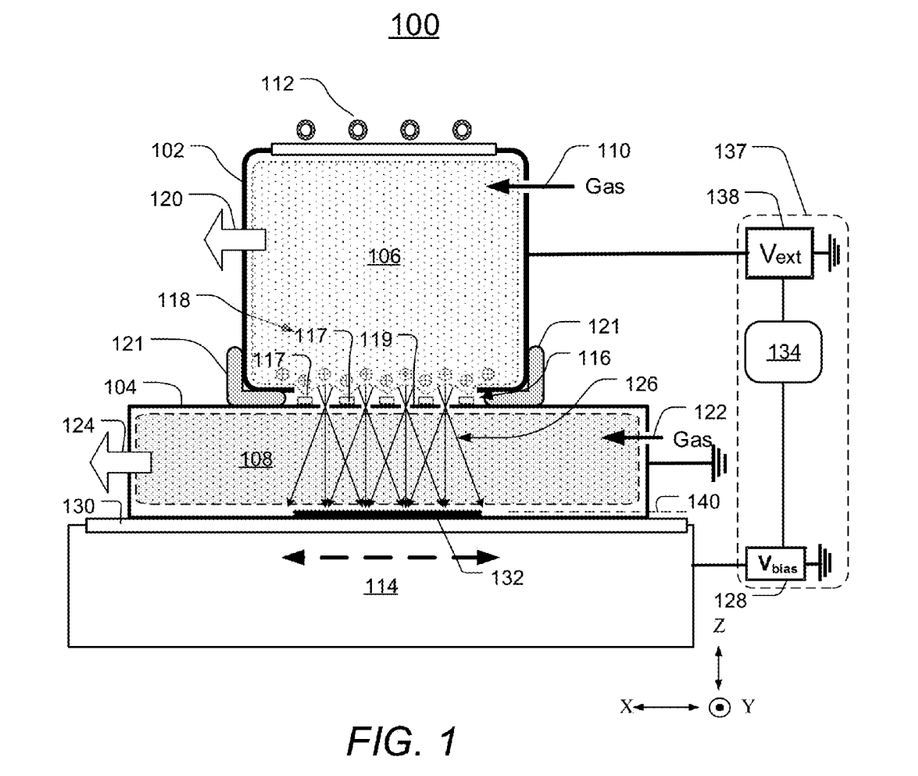
FIG. 1 is a schematic depiction of an exemplary processing system consistent with the present embodiments.

FIG. 1 depicts an exemplary processing system 100 consistent with the present embodiments. The processing system 100 includes a first chamber that acts as an ion source and is termed herein an ion beam chamber 102. The processing system 100 further includes a second chamber termed a plasma chamber 104, which is disposed adjacent to the ion beam chamber 102. The plasma chamber 104 is electrically isolated from the ion beam chamber 102 via the insulator 121. The ion beam chamber 102 is configured to define plasma 106, which may be generated when gaseous species are admitted into the ion beam chamber 102 and when an RF coil 112 is energized. Although FIG. 1 depicts that the plasma 106 is generated by an RF coil 112, in other embodiments other known techniques may be used to generate the plasma 106. For example, a plasma source for the plasma 106 may, in various embodiments, be an in situ or remote, inductively coupled plasma source, capacitively coupled plasma source, helicon source, microwave source, or any other type of plasma source. In FIG. 1, there is depicted a gas inlet 110, which may admit any desired gaseous species to the ion beam chamber 102. However, multiple different gas inlets may be employed to admit different or the same gaseous species in other embodiments. A pump port 120 is provided to exhaust gaseous species out of the ion beam chamber 102.

Turning now to the plasma chamber 104, there is shown a gas inlet 122 which may be employed to provide gaseous species directly to the plasma chamber 104. However, multiple different gas inlets may be employed to admit different or the same gaseous species into plasma chamber 104 in other embodiments. The plasma chamber 104 also includes an exhaust port 124 to exhaust gaseous species out of the plasma chamber 104. By providing gas inlets and exhaust ports in each of the ion beam chamber 102 and plasma chamber 104, the processing system 100 facilitates the ability to generate simultaneously or in an alternating fashion, different types of plasmas in the different respective chambers, including plasmas that have different ion and neutral species, as well as different pressure ranges.

As further shown in FIG. 1, a substrate assembly 114 is provided adjacent a portion of the plasma chamber 104. The substrate assembly 114 is configured to support substrates such as the substrate 132 so as to expose a surface of the substrate 132 to species from the ion beam chamber 102 and plasma chamber 104. The substrate assembly 114 includes a substrate holder 130 that may be coupled to or form part of a stage (not separately shown), which provides for scanning and/or heating/cooling of the substrates before, during, or after exposure to species from plasma chamber 104 and ion beam chamber 102.

The processing system 100 also includes an extraction assembly 116 located between the ion beam chamber 102 and plasma chamber 104. As detailed with respect to the FIGS. to follow, the extraction assembly 116 is used to extract ions 118 from the ion beam chamber so as to provide ions to substrates 132. The extraction assembly 116 may include a single extraction plate (electrode), shown as extraction plate 117, in some embodiments or may include multiple extraction plates in other embodiments. The extraction plate 117 is also isolated from the ion beam chamber 102 and may be electrically connected to the plasma chamber 104. In some embodiments the plasma chamber 104 and extraction assembly 116 are grounded such that the extraction assembly 116 extracts ions 118 with an energy that is defined by the voltage applied to the ion beam chamber 102 as detailed below. In other embodiments, the extraction assembly 116 or portions of the extraction assembly 116 may be insulating and may have a floating potential in which case ions are extracted from the on beam chamber at an energy determined by a difference between the plasma potential of the plasma 106 and floating potential of the extraction assembly 116.

The extraction assembly 116 also provides gas and plasma isolation between the ion beam chamber 102 and plasma chamber 104 such that separate plasmas 106, 108 that may have different plasma species are maintained. As illustrated in FIG. 1, the ion beam chamber 102, plasma chamber 104 and substrate assembly 114 are mutually arranged such that ions extracted from the plasma 106 as well as plasma 108 may be directed in line of sight trajectories to a substrate 132.

As particularly shown in FIG. 1, the extraction assembly 116 may include multiple insulator features, shown as insulators 119, that act to modify a plasma boundary shape proximate the extraction assembly 116 and thereby generate ions 118 that exit the plasma over a range of angles. In particular, referring also to FIG. 2C for clarity, the extraction plate 117 may include a plurality of holes or slots, shown as apertures 115. A given aperture 115 may be bounded by an insulator 119 or a pair of insulators 119, where the insulators 119 are disposed between the plasma 106 and extraction plate 117, as shown in FIGS. 1 and 2C, for example. As illustrated in FIG. 1, ions 118 that are extracted from the ion beam chamber 102 may travel through the plasma chamber 104 along the trajectories 126 before impinging upon the substrate(s) 132. In addition, ions and/or other gaseous species (neither shown for clarity in FIG. 1) that are generated in plasma chamber 104 may impinge upon the substrates 132.

As detailed below, the processing system 100 provides a biasing system that includes an ion beam chamber voltage source and a bias voltage supply that operate to generate pulses of ions from the ion beam chamber 102 and pulses of ions from the plasma chamber 104. The pulses of ions from the ion beam chamber 102 may be generated in first time periods that are different from second time periods in which pulses of ions from the plasma chamber 104 are generated.

In operation, ions from the ion beam chamber 102 may be directed to the substrates 132 when the plasma 106 is biased at a potential (voltage) with respect to substrates 132. The biasing system 137 includes an ion beam chamber voltage source, termed voltage source $V_{EXT}$ 138, that is configured to bias the ion beam chamber 102 at a potential such as a positive potential with respect to the extraction assembly 116. This serves to extract positive ions from the plasma 106 through the extraction assembly 116 with an energy defined by the difference between the plasma potential of the plasma 106 and the voltage at the extraction assembly 116, which may be at ground. The ions 118 extracted from the plasma 106 are directed to the substrates 132 with an energy defined by the difference between the plasma potential of the plasma 106 and the potential at the substrates 132. In addition, plasma 108 may be generated when the substrate assembly 114 is biased with respect to the plasma chamber 104. As illustrated in FIG. 1, the biasing system 137 of processing system 100 further includes a bias voltage supply $V_{BIAS}$ 128 that is coupled to the substrate assembly 114, while the plasma chamber 104 may be separately biased or coupled to ground. In some cases, the plasma 108 may be ignited when the bias voltage supply $V_{BIAS}$ 128 supplies a sufficient bias voltage (also referred to as $V_{BIAS}$) with respect to the plasma chamber potential, as in conventional PLAD systems. In other cases as explained below $V_{BIAS}$ may be a positive voltage that is applied to substrate 132 to modify properties of ions 118. In various embodiments, for example, $V_{BIAS}$ may range from about +500 V to about −5000 V.

The biasing system 137 of processing system 100 also includes a timing circuit 134 that is coupled to the supply $V_{EXT}$ 138 and the bias voltage supply $V_{BIAS}$ 128. As detailed below, the timing circuit 134 is configured to adjust timing of voltage signals provided by the supply $V_{EXT}$ 138 and the bias voltage supply $V_{BIAS}$ 128, so that processing of substrates by ions from the plasma 108 and ions 118 can be tailored according to a desired treatment.

In various embodiments, the processing system 100 may be used to treat a substrate 132 in a novel manner not achieved by conventional processing apparatus. This may be especially useful to modify traditional processing steps in which an exposure to ions involves an exposure to a single plasma or ion beam, or alternatively requires exposure to different ion beams/plasma in a separate apparatus or in separate steps. For example, a traditional PLAD tool may perform ion-assisted deposition to deposit a doped layer on a substrate. The deposition of the doped layer may entail both ion-assisted condensation of species to form the doped layer, as well as ion knock-on processes to treat the growing layer. Conventionally, these processes take place as part of a single PLAD process step and are not adjusted in an independent fashion from one another.

However, consistent with the present embodiments, a first ion treatment by ions 118 extracted from the ion beam chamber 102 may be performed upon the substrate 132 independently of a second ion treatment that is performed by ions generated from the plasma chamber 104. In various embodiments, the second ion treatment from ions generated in the plasma chamber 104 may include ion-assisted deposition, ion-assisted passivation, ion assisted-etching, and/or ion-assisted cleaning of a substrate 132.

In one example, ions extracted from plasma 108 and/or other reactive species (neither separately shown in FIG. 1) may be configured to deposit into a growing layer upon the substrates 132, while ions 118 extracted from the plasma 106 may be used to perform knock-on processes upon the growing layer. In particular embodiments, periods of deposition from species generated in plasma 108 may be alternated with periods of treatment using the ions 118. For example, the voltage source $V_{EXT}$ 138 may be a pulsed DC power supply that is configured to provide pulses of high voltage. In some embodiments, the pulses may be generated at a frequency of 1 KHz or greater. In some embodiments in which the ions 118 are provided as pulsed ions, the pulsed voltage applied by the voltage source $V_{EXT}$ 138 may be in a range of about 100 V to 20 kV. The value of RF power, voltage applied, pulse repetition frequency and duty factor of voltage pulses may be tailored to control the electron energy distribution function, electron density and electron temperature in the plasma 106 to control properties of ions 118 to be directed at the substrate 132. Such properties may include the ion dose and angle of incidence of ions 118 with respect to a plane of the substrate 132.

In various embodiments, the plasma 108 may be provided as pulsed plasma. In some embodiments the ions 118 of plasma 106 as well as ions (not separately shown) from plasma 108 may include inert gas ions derived from inert gas species such as $H_2$, He, Ne, Ar, Xe, as well as $N_2$, and so forth. In other embodiments the ions 118 may be derived from a condensing species (e.g., $SiH_4$) to condense into a growing film on the substrate 132, or may be derived from semiconductor dopant gaseous species (e.g. $BF_3$, $B_2F_4$, $AsH_3$, $PH_3$, etc.). In still further embodiments, the extracted ions 118 and ions of plasma 108 may be reactive gas ions derived from a reactive gas such as $O_2$, $XeF_2$, $CF_4$, and so forth. In other embodiments, the ions 118 and ions of plasma 108 may be any combination of the aforementioned inert gas, reactive gas, or condensing gas. The embodiments are not limited in this context. In particular this embodiment enables control of plasma parameters of plasma 108 by means of injecting ions 118 extracted from the plasma 106.

In particular embodiments, the plasma 108 may be pulsed so that periods in which the plasma 108 is ignited may alternate with periods in which pulses of ions 118 are directed toward the substrates 132. In this manner, different ion treatments may be provided to the substrate 132 in rapid succession. A process of alternating different ion treatments may provide, for example, ions for depositing a layer, and ions to densify or treat the surface of the depositing layer so as to affect the structure of the depositing film. By virtue of providing separate ion treatments from two different chambers, the processing system 100 may simulate treatment provided by two separate apparatus without having to transport substrates 132 between apparatus or perform separate steps. In addition, by providing the ability to alternate ion treatments in rapid succession, the processing system 100 can provide an effective treatment not achievable in conventional systems.

Figure 2A:
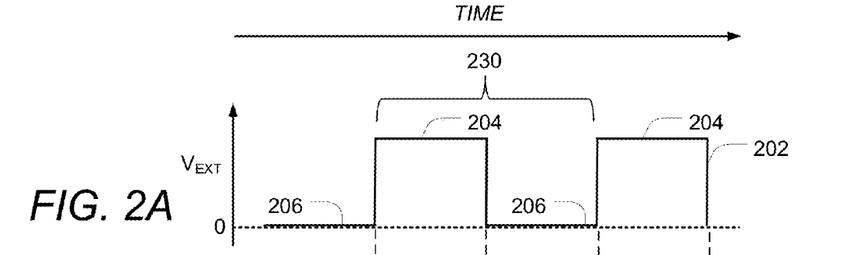
FIG. 2A depicts an exemplary voltage signal for a first plasma of an apparatus consistent with the present embodiments.

FIG. 2A depicts an exemplary voltage signal 202 that may be generated by the voltage source $V_{EXT}$ 138 to the ion beam chamber 102. The voltage signal 202 represents the voltage level $V_{EXT}$ as a function of time. As illustrated in FIG. 2A, the voltage signal 202 includes alternating voltage pulses 204, in which a relatively high voltage is applied, with low voltage signals 206, in which the voltage level may be zero in some instances. When the voltage pulses 204 are applied the potential of the ion beam chamber is raised to a high positive voltage, such as above 100 V. In some cases the potential of the extraction assembly 116 may be maintained at ground. Accordingly, because the plasma potential of plasma 106 is slightly positive (typically by an amount ~2-30 V) with respect to $V_{EXT}$, ions 118 are accelerated through the extraction assembly 116 experiencing a potential drop slightly greater than $V_{EXT}$. The ions may then continue along the trajectories as generally illustrated by trajectories 126 before striking the substrate 132. The distribution of angles of incidence of trajectories 126 with respect to a plane 140 of substrate 132 may be tailored as described below. During periods in which the low voltage signal 206 is applied, the difference between the plasma potential of plasma 106 and the extraction assembly 116 may be slight, for example, less than 30 V, such that ions 118 are generally not accelerated out of the plasma 106 and therefore do not impinge upon the substrate 132.

Accordingly, the voltage signal 202 may generate ion beam pulses that impinge periodically upon a substrate, such as the substrate 132. In some embodiments, the alternating voltage pulses 204 are generated in a regular periodic fashion at a frequency between successive pulses of 1 kHz or greater, though in other embodiments, the frequency of voltage pulses 204 may be less than 1 kHz. In one example the voltage pulses 204 occupy a duty cycle of 50% such that the time period 220 of the voltage pulses 204 occupies one half of one cycle that includes the sum of one time period 218 of the low voltage signal 206 and one time period 218. Accordingly, for a 1 kHz frequency, corresponding to a cycle of 100 µs, the duration of a voltage pulse 204 is 500 µs.

Figure 2B:
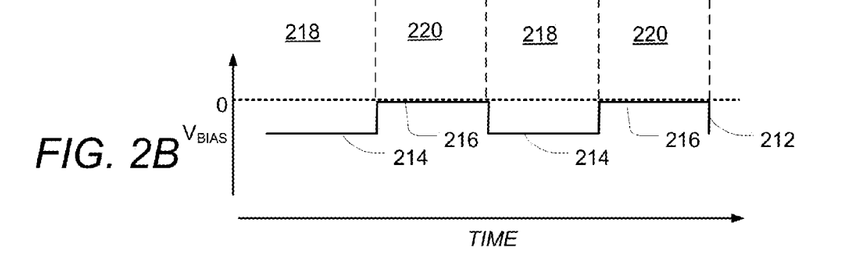
FIG. 2B depicts an exemplary second voltage signal for a second plasma that may be used in conjunction with the voltage signal of FIG. 2A.
Figure 2C:
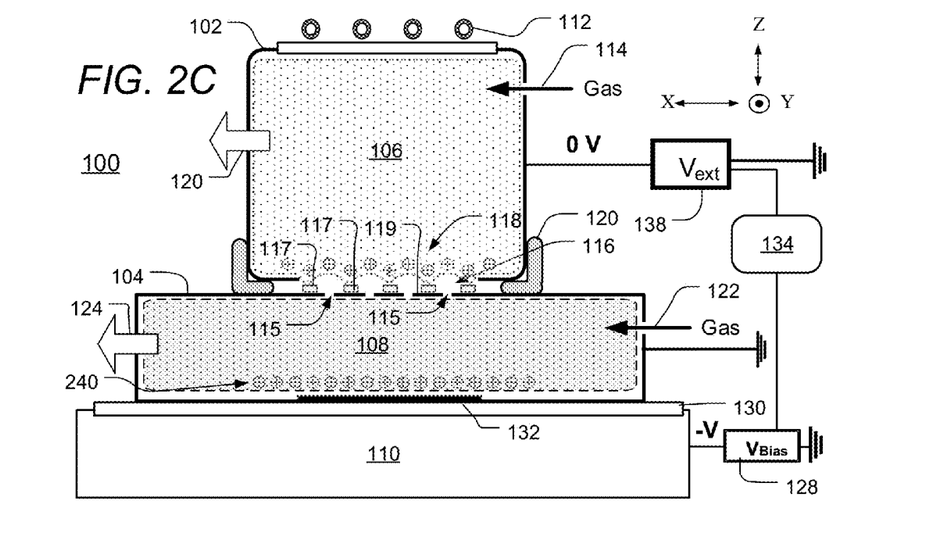
FIG. 2C depicts details of one scenario of operation of the processing system of FIG. 1 in a first instance.

FIG. 2B illustrates a voltage signal 212 that may be applied to a substrate in accordance with various embodiments. As illustrated, the voltage signal 212, which represents the voltage level of $V_{BIAS}$ applied to the substrate assembly 114, includes a series of voltage pulses 214 in which the voltage level is biased negatively with respect to zero volts. Consistent with some embodiments, the timing of the voltage signal 212 is synchronized with the voltage signal 202 as shown in the dotted lines connecting the FIGS. 2A and 2B. Thus, a voltage pulse 214 of $V_{BIAS}$ takes place during a time period 218 in which $V_{EXT}$ is applied to the ion beam chamber 102 as the low voltage signal 206. Additionally, a low voltage signal 216, meaning a signal in which $V_{BIAS}$ is zero or has an absolute value less than that of the voltage pulses 214, takes place during the periods 220 in which the $V_{EXT}$ is applied to the ion beam chamber 102 as the voltage pulses 204. Because the voltage signal 212 that generates $V_{BIAS}$ is applied to the substrate assembly 114 with respect to the plasma chamber 104, and because the plasma chamber 104 is electrically isolated from the ion beam chamber 102, the voltage levels set by the voltage signal 212 are completely independent of voltage set by the voltage signal 202. The voltage level of $V_{BIAS}$ may therefore be set to an appropriate level for generating a plasma within plasma chamber 104 regardless of the voltage level of $V_{EXT}$ and ion energy of the ions 118. In this manner, the voltage level of $V_{BIAS}$ and pulsing properties may be optimized for a particular process deposition/etching of the substrate. In this manner, during the periods 218, plasma 108 may be generated in the plasma chamber 104 to treat substrates 132, while during the periods 220 ions 118 may be directed to treat the substrates 132.

Figure 2D:
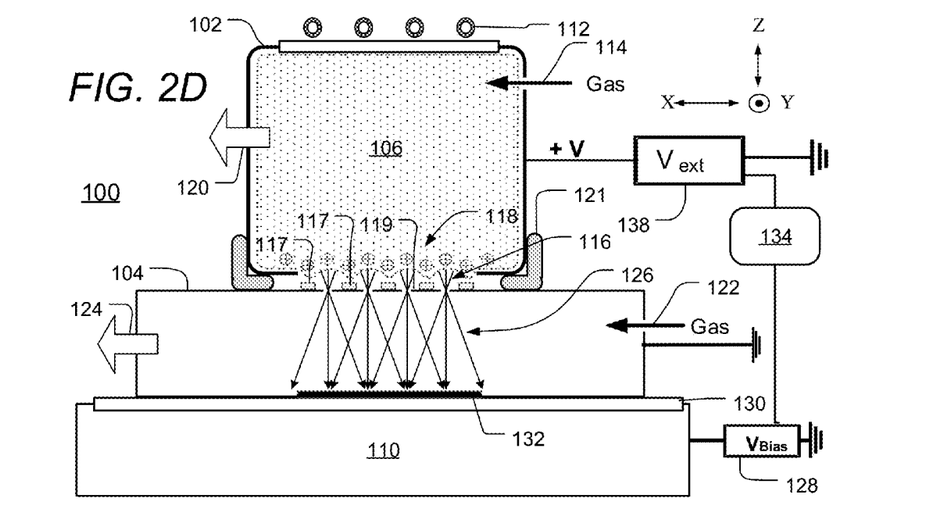
FIG. 2D depicts details of the scenario of operation of FIG. 2C in a second instance.

To further illustrate operation of the embodiments, FIGS. 2C and 2D depict two different instances during operation of the processing system 100 consistent with the embodiments depicted in FIGS. 2A and 2B. In particular, FIG. 2C depicts one scenario that corresponds to a time period 218. As illustrated, plasma 106 is present in the ion beam chamber 102. However, $V_{EXT}$ is set to zero V, resulting in a low plasma potential for the plasma 106 such as about several volts to twenty volts positive. As a result, (positive) ions 118 that form in the plasma 106 are not accelerated out of the plasma 106 through the extraction assembly 116 and do not impinge upon the substrates 132. In the plasma chamber 104, during the time period 218, plasma 108 is formed by the application of $V_{BIAS}$. Ions 240, which may be positive ions, as well as other species in the plasma chamber 104, may impinge upon the substrate 132 at this time. Since the plasma chamber 104 may be grounded, resulting in a plasma potential of the plasma 108 only slightly positive (<~+30 V) the ions 240 may acquire an energy determined predominantly by the level of $V_{BIAS}$. In examples in which the ions 240 and/or other species in the plasma chamber 104 are configured to deposit into a coating on the substrate 132, the rate of deposition of a growing layer may be controlled by the magnitude of $V_{BIAS}$, the duty cycle of the time period 218, as well as the gas pressure within the plasma chamber 104, among other factors.

Turning now to FIG. 2D, there is shown one scenario that corresponds to a time period 220. As illustrated, plasma 106 is present in the ion beam chamber 102. Because $V_{EXT}$ is set to a positive voltage corresponding to a voltage pulse 204, the plasma potential for the plasma 106 may attain a large positive voltage, such as about +1010 V when $V_{EXT}$ is set to +1000 V. As a result, (positive) ions 118 formed in the plasma 106 are accelerated out of the plasma 106 through the extraction assembly 116 and impinge upon the substrates 132. In the case where the voltage of the low voltage signal 216 is set to zero, the ions 118 may then strike the substrates with an energy that is defined by the ~1010 V potential difference between the plasma potential of plasma 106 and the zero volt level of the substrates 132, which may be about 1010 eV in the case of singly charged positive ions.

In the scenario generally outlined in FIGS. 2A-2D substrates 132 are alternately treated with ions 118 and ions 240. Because each of chambers 102 and 104 are provided with separate gas inlets (110, 122) and separate gas exhaust ports (120, 124), the gas composition and gas pressure may be individually tailored within each of the chambers 102, 104, thereby providing a large degree of process flexibility. For example, a reactive deposition gas may be provided into the plasma voltage pulse 214 is applied to plasma chamber 104, thereby generating the plasma 108 and accelerating ions 240 to the substrate 132. In some cases, plasma deposition may require a relatively higher pressure than is desirable for operation of plasma in ion beam chamber 102. Because of the separate gas inlets and outlets provided, a higher gas pressure may be maintained within the plasma chamber 104 as compared to ion beam chamber 102. The extraction system 116 may also limit gas conductance between plasma chamber 104 and ion beam chamber 102, thereby further supporting the ability to maintain a pressure differential between the two chambers 102, 104.

On the other hand, an inert gas may be provided into ion beam chamber 102 which generates an inert gas ion beam to treat the substrates 132 during the time periods 220. Because of the limited gas conductance through the extraction assembly 116 and the ability to pump gas in plasma chamber 104 through the exhaust port 124, the flow of reactive gas into the ion beam chamber 102 may be limited, thereby ensuring that the composition of ions 118 formed in plasma 106 is as desired, such as predominantly composed of inert gas ions in one example.

Moreover, because each of the time periods 218, 220 may be separated from respective successive time periods 218, 220 by a duration of only on the order of hundreds of microseconds, the treatment of substrates 132 may proceed as if the individual ion treatments produced by the voltage pulses 204, 214 were continuous. As an example, in the case where a semiconducting layer is to be deposited conformally upon a substrate having 3-D surface structures, it may be desirable to provide knock-on ion treatment using inert gas ions on a quasi-continuous basis so that the inert gas ions properly rearrange atoms in the growing layer. Accordingly, the voltage pulses 204, 214 may be set for sufficiently short duration that only a small amount of semiconductor layer deposition occurs between successive treatments by inert gas ions. In various additional embodiments, gas may be admitted in pulses through the gas inlet 122 to generate a pulsed plasma in the plasma chamber 104. The gas pulses may be synchronized with ion beam pulses such as those produced by the voltage pulses 204 so as to produce alternating plasma pulses and ion beam pulses similar to alternating plasma/ion beam pulses described above with respect to FIGS. 2A, 2B. However, the use of gas pulses to produce pulsed plasmas may be more effective when the pulse period is greater than about 1 ms due to limitations on the rate of igniting and extinguishing a plasma that is imposed by gas flow control.

Figure 3A:
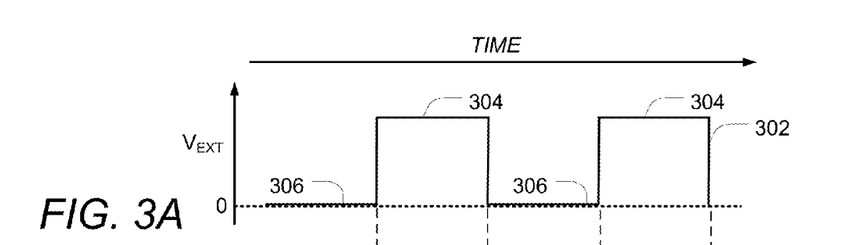
FIG. 3A depicts an exemplary voltage signal for a first plasma of an apparatus consistent with the present embodiments.
Figure 3B:
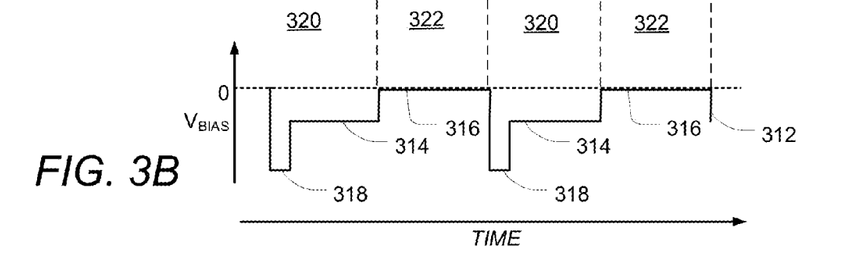
FIG. 3B depicts an exemplary third voltage signal for a second plasma that may be used in conjunction with the voltage signal of FIG. 3A.

FIGS. 3A and 3B depict exemplary voltage signals 302, 312 that may be generated by the processing system 100 consistent with further embodiments. The exemplary voltage signal 302 may be applied by the voltage source $V_{EXT}$ 138 to the ion beam chamber 102 while the voltage signal 312 may be applied to a substrate as $V_{BIAS}$ in accordance with various embodiments. As illustrated, the timing of the voltage signals 302 and 312 may be synchronized so as to define a series of time periods 320 that alternate with time periods 322. In one example, the voltage signal 302, which includes the voltage pulses 304 and low voltage signals 306, may be similar to that of voltage signal 202. Thus the voltage pulse 304 may be applied to create a series of pulses of positive ions that are extracted from the plasma 106 and accelerated toward the substrate 132. Similarly to the voltage signal 212 described above, the voltage signal 312 may be used to generate a pulsed plasma during the time periods 320. However, in this case in addition to the low voltage signals 316 generated during the time periods 322, the voltage signal 312 includes a signal portion 318 and signal portion 314 within each time period 320. The signal portion 318 represents a voltage pulse having a greater negative bias than that of signal portion 314. This may be useful to ignite a plasma 108 during an initial period, while the voltage level of $V_{BIAS}$ set by the signal portion 314 may define a desired voltage level for processing for the bulk of the time period 320, which may be reflect a lesser negative bias and therefore lower ion energy than that produced by the initial signal portion 314.

Figure 4A:
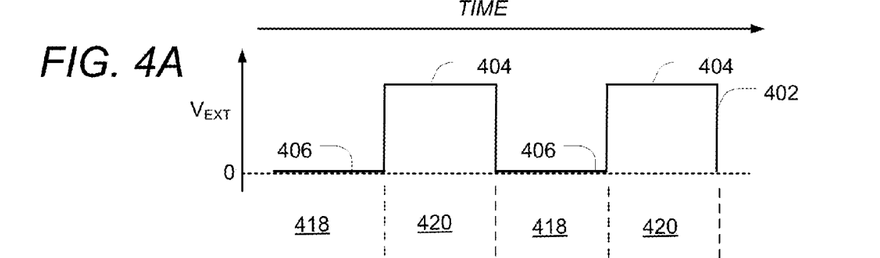
FIG. 4A depicts an exemplary voltage signal for a first plasma of an apparatus consistent with the present embodiments.
Figure 4B:
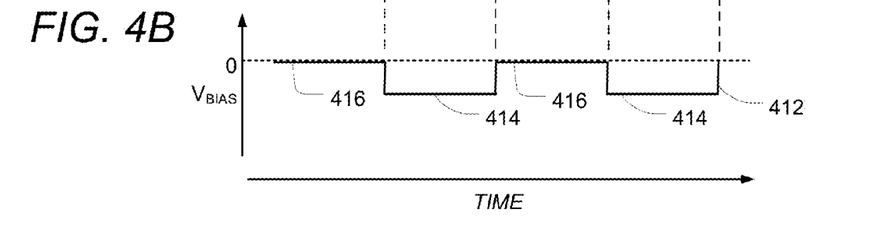
FIG. 4B depicts an exemplary fourth voltage signal for a second plasma that may be used in conjunction with the voltage signal of FIG. 4A.
Figure 4C:
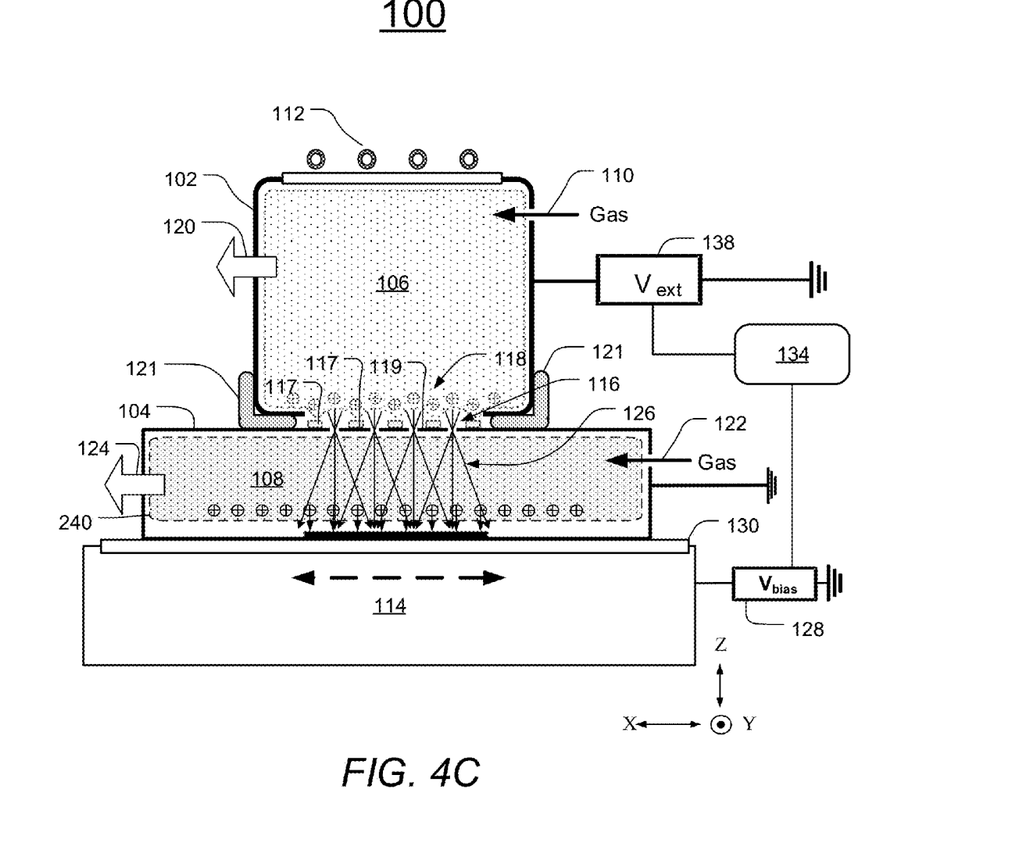
FIG. 4C depicts details of an additional scenario of operation of the processing system of FIG. 1 in an instance resulting from the voltage signals of FIGS. 4A and 4B.

FIGS. 4A and 4B depict exemplary voltage signals 402, 412 that may be generated by the processing system 100 consistent with further embodiments. The exemplary voltage signal 402 may be generated by the apparatus $V_{EXT}$ 138 to the ion beam chamber 102 while the voltage signal 412 may be applied to a substrate as $V_{BIAS}$ in accordance with various embodiments. As illustrated, the timing of the voltage signals 402 and 412 may be synchronized so as to define a series of time periods 418 that alternate with time periods 420. In one example, the voltage signal 402, which includes the voltage pulses 404 and low voltage signals 406, may be similar to that of voltage signal 202. Thus a voltage pulse 404 may be applied to create a series of pulses of positive ions that are extracted from the plasma 106 and accelerated toward the substrate 132 during the time periods 420. Similarly to the voltage signal 212 described above, the voltage signal 412 may be used to generate a pulsed plasma. However, instead of generating a pulsed plasma in the periods during the time periods 418 that alternate with the time periods 420, the voltage signal 412 produces negative voltage pulses 414 in the time periods 420 simultaneously with the voltage pulses 404. Additionally the low voltage signals 406 occur simultaneously to the low voltage signals 416 so as to define the time periods 418. In this arrangement, a substrate such as the substrate 132 is exposed to both ions 118 and ions 240 at the same time. This scenario is depicted in FIG. 4C, which depicts the state of processing system 100 during a time period 420. Thus, in the scenario of FIG. 4C, both inert gas ions (ions 118) and depositing ions (ions 240) may be directed to a substrate at the same time. However, unlike in a conventional PLAD system in which ions generated in a plasma generally impinge upon a substrate with the same energy and angle(s) of incidence, in the example of FIGS. 4A-4C, two different ion energies are set by respective $V_{EXT}$ and $V_{BIAS}$ voltage pulses, that is voltage pulses 404 and 414, and ion trajectories between ions extracted from the ion beam chamber 102 and plasma chamber 104 may differ.

Figure 5A:
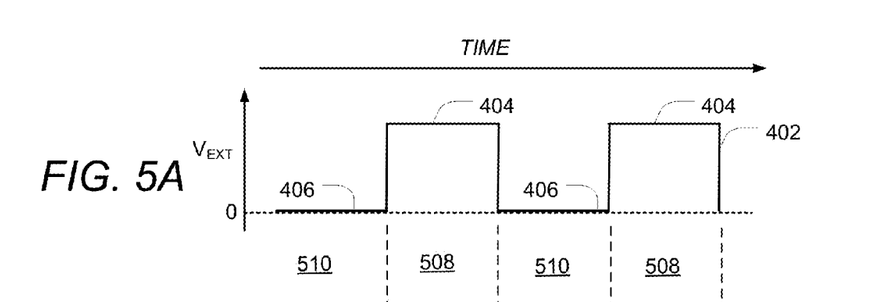
FIG. 5A depicts an exemplary voltage signal for a first plasma of an apparatus consistent with the present embodiments.
Figure 5B:
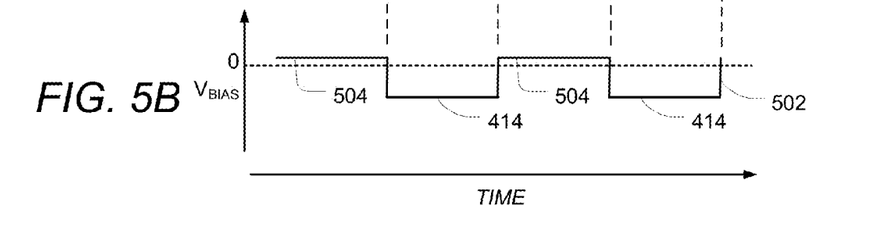
FIG. 5B depicts an exemplary fifth voltage signal for a second plasma that may be used in conjunction with the voltage signal of FIG. 5A.

Another advantage afforded by the dual chamber configuration of the processing system of the present embodiments is that charge neutralization can be conveniently maintained on substrates being processed. For example, a $V_{BIAS}$ voltage signal may be set as a bipolar voltage signal in which periods of positive voltage bias alternate with periods of negative voltage bias. FIGS. 5A and 5B depict a variant of the scenario provided by the voltage signals 402, 412 of FIGS. 4A and 4B. In this case, the $V_{EXT}$ signal applied to ion beam chamber 102 may be the same voltage signal 402 as shown in FIG. 4A. In addition, as shown in FIG. 5B, the voltage signal 502 contains voltage pulses 414 as in FIG. 4B. Accordingly, in the time periods 508, simultaneous processing of a substrate from ions 118 and ions 240 may take place as described above. However, in the time periods 510 that alternate with time periods 508, the low voltage signals 504 that represent $V_{BIAS}$ delivered to the substrate 132 exhibit a small positive bias. For example $V_{BIAS}$ may equal +10 to +20 V for low voltage signals 504. In this manner electrons may be accelerated toward the substrate 132 during the time periods 508, which may aid in neutralizing positive charge accumulated on the substrate 132 during bombardment by positive ions in time periods 508.

It is to be noted that a bipolar $V_{BIAS}$ voltage signal may also be applied to the substrate in other embodiments in which periods of plasma ion treatment from ions in plasma chamber 104 alternate with periods of ion beam treatment from ion beam chamber 102, as generally depicted in the FIGS. 2A-3B.

Figures 6A, 6B:
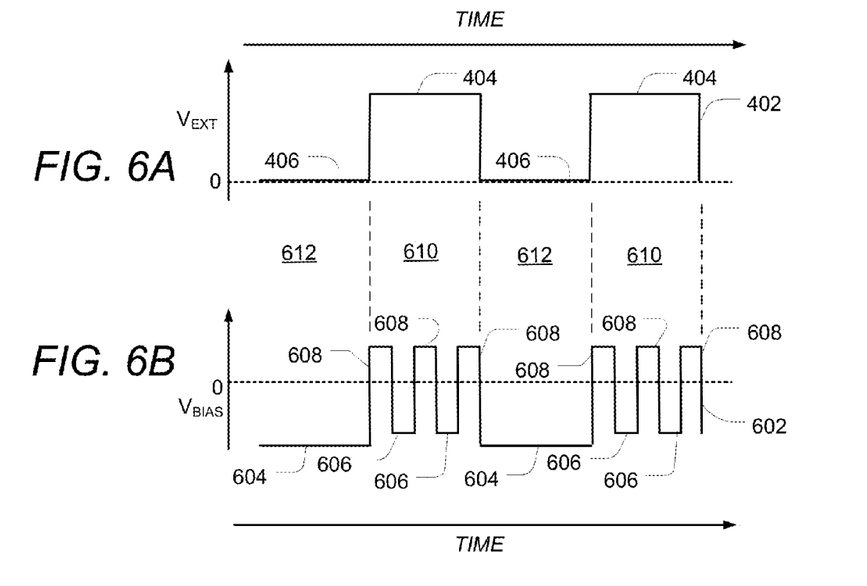
FIG. 6A depicts an exemplary voltage signal for a first plasma of an apparatus consistent with the present embodiments.
FIG. 6B depicts an exemplary sixth voltage signal for a second plasma that may be used in conjunction with the voltage signal of FIG. 6A.

FIGS. 6A and 6B another scenario for proving voltage signals to a dual chamber processing system consistent with further embodiments. In this case, the $V_{EXT}$ signal applied to ion beam chamber 102 may be similar to or the same as the voltage signal 402 as shown in FIG. 4A. Accordingly, the voltage signal 402 may be used to generate a series of ion beam pulses of positive ions that are directed toward a substrate, such as the substrate 132 during the time periods 610.

In addition, as shown in FIG. 6B, a voltage signal 602 is provided to generate pulses of $V_{BIAS}$ to a substrate. In particular, during each time period 612, which alternates with the time periods 610, a negative voltage pulse 604 is provided. The negative voltage pulses 604 may be of sufficient voltage to ignite and/or sustain a plasma during the time periods 612 with a result that the substrate is subjected to ions from the plasma during the time periods 612. In addition, the voltage signal 602 contains a series of multiple pulses within each time period 610, which accordingly overlap in time with ion beam pulses generated by the voltage pulses 404 for the $V_{EXT}$ signal shown in FIG. 6A. As illustrated in FIG. 6B the voltage signal 602 oscillates between negative and positive voltage values in the time periods 610, which creates a series of positive voltage pulses 608 that alternate with negative voltage pulses 606. The pulse frequency of positive voltage pulses 608 and negative voltage pulses 606 is greater than the pulse frequency of voltage pulses 404 since multiple oscillations between negative and positive voltage occur for the voltage signal 602 within each time period 610. One result of this oscillation is that alternating bursts of positive ions and electrons may be directed toward the substrate. Ions extracted from an ion beam chamber that is biased to the $V_{EXT}$ level set by the voltage pulse 404 experience a varying voltage drop between substrate (132) and plasma 106.

In one example, $V_{EXT}$ is equal to 1000 V during a voltage pulse 404, and $V_{BIAS}$ is equal to +100 V during a positive voltage pulse 608 and −150 V during a negative voltage pulse 606. Accordingly, during a positive voltage pulse 608 positive ions are accelerated from an ion beam chamber such as ion beam chamber 102 through a voltage drop of 900 V, while during a negative voltage pulse 606 ions are accelerated through a voltage drop of 1150 V. One effect of the varying voltage is to generate a larger spread in angle of incidence of ions extracted from an ion beam chamber as compared to an invariant substrate bias during the time periods 612. In this manner, the average angle of incidence for ions such as the ions 118 can be tailored according to a desired angular profile. It is to be noted that in some embodiments, depending upon the application, plasma may be maintained in a plasma chamber 104 during the negative voltage pulses 606, or the plasma may be extinguished during the negative voltage pulses 606.

In addition, as illustrated in FIG. 6A, by adjusting the voltage level of the voltage pulses 404 the overall average ion energy of ions can be adjusted independently of the variation in ion energy provided by the voltage pulses 606, 608. For example, it may be useful to provide a wide angular distribution of ions at low energy in order to generate a conformal coating on 3-D structures in a substrate. Accordingly, the voltage swing (amplitude difference) between the voltage level (voltage amplitude) of a positive pulse 608 and a negative voltage pulse 606 may be set at a relatively higher value to create a wide angular distribution, while the voltage level for voltage pulses 404 is set at a relatively lower value to generate a relatively lower average ion energy at the substrate.

Figure 7A:
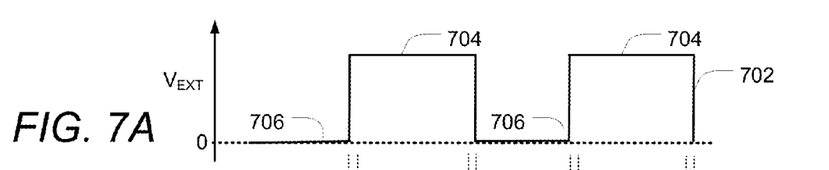
FIG. 7A an exemplary voltage signal for a first plasma of an apparatus consistent with the present embodiments.
Figure 7B:
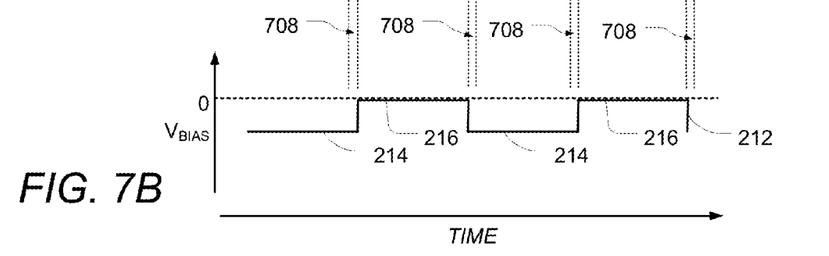
FIG. 7B depicts an exemplary seventh voltage signal for a second plasma that may be used in conjunction with the voltage signal of FIG. 7A.

In additional embodiments, other voltage waveforms may be applied to generate voltage signals $V_{EXT}$ and $V_{BIAS}$. For example, rather than exhibiting the abrupt voltage changes in a square wave, voltage in a voltage waveform for $V_{EXT}$ or $V_{BIAS}$ may be ramped more gradually. Moreover, the synchronization between $V_{EXT}$ and $V_{BIAS}$ voltage signals may be adjusted. For example, in the embodiments depicted in FIGS. 2A-3B the voltage pulses 204 of the voltage signal 202 do not generally overlap with the voltage pulses 214 of the voltage signal 212. However, in other embodiments, as illustrated in FIGS. 7A and 7B positive voltage pulses for $V_{EXT}$ may overlap with negative voltage pulses for $V_{BIAS}$. In the example of FIG. 7B, the $V_{BIAS}$ signal that is applied to the chamber is generated as the voltage signal 202 described above with respect to FIG. 2. However, in FIG. 7A the $V_{EXT}$ signal is generated as a voltage signal 702 that includes low voltage signals 706 and voltage pulses 704 that overlap with the voltage pulses 214. This results in the presence of an ion beam at substrate 132 at the beginning and ending of periods in which plasma 108 is present in the plasma chamber 104. These overlap periods 708 may be useful when it is desirable for knock-on implantation to take place during the beginning and ending or periods of film deposition in the case in which the plasma 108 is used to deposit material on substrate 132.

In further embodiments, instead of providing overlapping pulses, voltage signals for $V_{EXT}$ and $V_{BIAS}$ may be generated in a manner that pulses for $V_{EXT}$ underlap pulses for $V_{BIAS}$, that is there are periods in which neither a positive voltage pulse is present at the ion beam chamber 102 nor a voltage pulse present at the substrate 132.

Figure 8A:
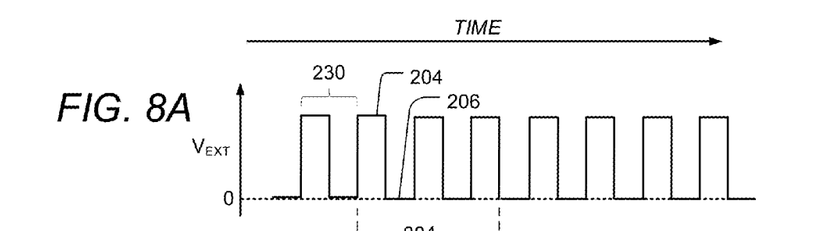
FIG. 8A an exemplary voltage signal for a first plasma of an apparatus consistent with the present embodiments.
Figure 8B:
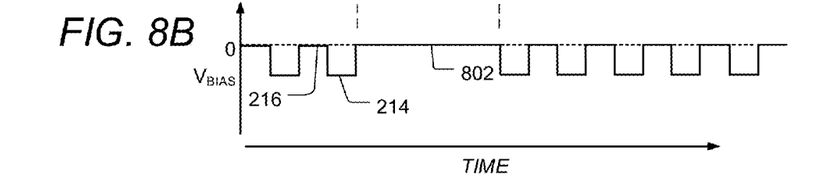
FIG. 8B depicts an exemplary eighth voltage signal for a second plasma that may be used in conjunction with the voltage signal of FIG. 8A.

In additional embodiments, a $V_{BIAS}$ voltage signal may be applied in a manner in which a plasma 108 in the plasma chamber 104 remains extinguished for one or more cycles of $V_{EXT}$ voltage pulses applied to the ion beam chamber 102. This arrangement may be useful when it is desirable, for example, to optimize treatment of a growing layer using an ion beam extracted from the ion beam chamber 102. FIGS. 8A and 8B depict one example of voltage signal timing in which a $V_{BIAS}$ signal is not applied for several cycles. As illustrated in FIG. 8A, a voltage signal 202 is generated to apply the $V_{EXT}$ voltage in a series of voltage pulses 204 as described above. In particular, a voltage pulse 204 is applied regularly in each cycle 230. In comparison, a voltage signal 802 that is generated to apply the $V_{BIAS}$ signal to a substrate generates a series of voltage pulses 214 that alternate with the voltage pulses 204. However, as illustrated in FIG. 8B, during the interval 804, which spans multiple cycles 230, no voltage pulses 214 are generated.

In still further embodiments, one or more components of the extraction assembly 116 may be modified to enhance the ability to generate ions over a range of angles of incidence. In some embodiments, the extraction assembly includes an extraction plate that provides holes or slots having partially conductive surface and partially insulating surface as disclosed, for example, in U.S. Pat. No. 7,767,977 and incorporated herein by reference in its entirety. In other embodiments, an electrically conductive extraction assembly may be provided with shaped holes or slots, which may control a shape of a plasma boundary in the plasma 106, as well known in the field of extraction optics design. In still further embodiments, a deceleration grid (not shown) may be provided together with one or more acceleration grids within the extraction assembly 116 in order to modify electric fields in the region where ions 118 are extracted from the plasma 106. This allows the angles of incidence of ions exiting the plasma 106 to be varied according to the voltage supplied to the deceleration grid.

Figure 9:
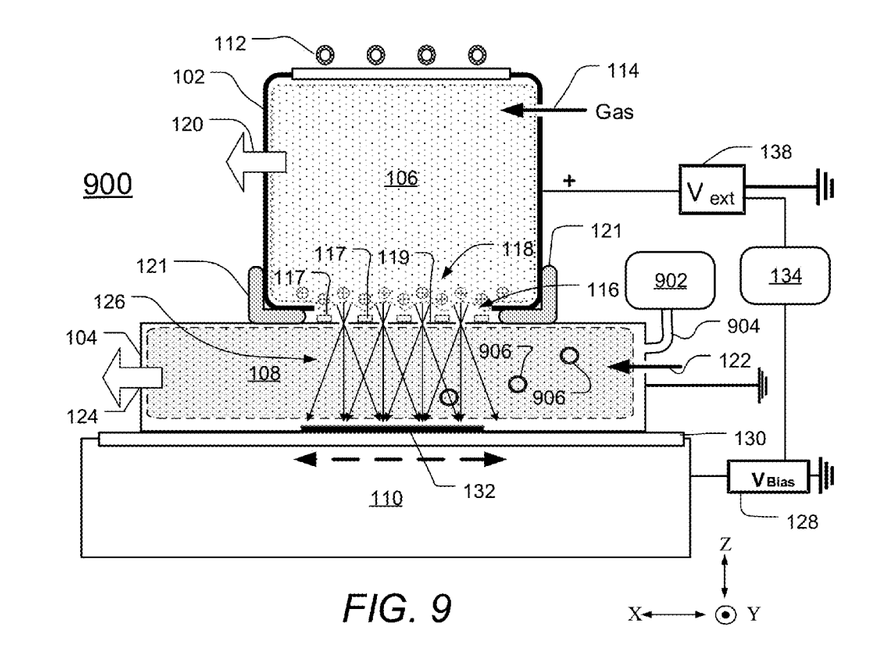
FIG. 9 is a schematic depiction of another exemplary processing system consistent with the present embodiments.

In various additional embodiments, a processing system may include a separate remote plasma source in addition to an ion beam chamber and adjacent plasma chamber. FIG. 9 depicts a processing system 900 that includes the aforementioned components of FIG. 1 and an additional remote plasma source 902. The remote plasma source 902 may generate a plasma (not separately shown) to supply gaseous species to the plasma chamber 104 that assist in plasma processing. Generally, the remote plasma source 902 may be arranged such that ions or other species generated in a plasma of the plasma source 902 do not impinge upon the substrate 132 in line-of sight trajectories. For example, the remote plasma source may supply activated gas species such as neutral radicals that may enhance chemical vapor deposition or chemical etching processes in plasma chamber 104 according to known mechanisms.

In one example, during treatment of a substrate 132, active gas species may be continuously supplied by the remote plasma source 902 via port 904 to plasma chamber 104 while voltage signals are generated according to the example of FIGS. 2A, 2B. During the time periods 218, therefore, the substrate 132 is exposed to ions generated in plasma 108 by the voltage pulses 214, as well as active species 906, which may enhance reaction with the substrate 132.

In summary novel apparatus and techniques are presented that combine substrate treatment from multiple plasma chambers. Independent control of multiple processes can be achieved by coupling a specific process to a plasma chamber, such as generating reactive deposition plasma in first chamber to deposit a film on the substrate, and generating an inert gas ion beam in another plasma chamber (ion beam chamber) to provide knock-on treatment of the substrate/growing film. This may facilitate optimizing processes such as deposition and re-sputtering, to produce superior surface quality of a deposited layer, including lower surface roughness. By using two separate pulsed voltage signals to a respective ion beam chamber and substrate assembly, the ion beam treatments can be combined into a quasi-single-step process where substrates are loaded into a single chamber in which the separate ion beam treatments occur while the substrate is located in the same position. In addition, by providing a timing circuit, the overlap of pulsed treatments from the two different plasma chambers may be adjusted as desired to control ion plasma parameters in the process chamber. Moreover, voltage signals applied to bias the substrate in a plasma chamber may be used to modify the angles and angular range of incident ions produced by ions extracted from a separate "ion beam" chamber, leading to better control of coating properties including the conformality of coatings deposited upon 3-D structures.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A processing system for processing a substrate, comprising:
   a first chamber operative to define a first plasma;
   a second chamber electrically isolated from the first chamber, and operative to define a second plasma;
   an extraction assembly disposed between the first chamber and second chamber to provide at least plasma isolation between the first plasma and the second plasma, wherein the extraction assembly comprises:
      an extraction plate having a plurality of apertures and being electrically connected to the second chamber; and
      a plurality of insulators configured to direct first ions over a range of angles with respect to the substrate, wherein the plurality of apertures are bounded by at least one insulator, the at least one insulator disposed between the first plasma and the extraction plate;
   a substrate assembly configured to support the substrate in the second chamber; and
   a biasing system configured to supply a plurality of first voltage pulses to direct the first ions from the first plasma through the second chamber towards the substrate during one time period, and to supply a plurality of second voltage pulses to generate the second plasma and to attract second ions from the second plasma during another time period.

2. The system of claim 1, wherein the biasing system comprises a first chamber voltage supply coupled to the first chamber and configured to generate the first voltage pulses as a plurality of pulses of positive voltage with respect to the extraction assembly.

3. The system of claim 1, wherein the biasing system comprises a substrate bias voltage supply coupled to the substrate assembly and configured to generate the plurality of second voltage pulses as a series of voltage pulses that are biased with respect to the first chamber and the second chamber.

4. The system of claim 3, the substrate bias voltage supply operative to:
   generate a first bias voltage during a plurality of first intervals, the first bias voltage configured to ignite the second plasma in the second chamber; and generate a second bias voltage having a magnitude less than the first bias voltage during a plurality of second intervals, each second interval immediately succeeding a respective first interval.

5. The system of claim 1, further comprising a timing circuit operative to adjust timing of the first voltage pulses with respect to the second voltage pulses.

6. The system of claim 5, further comprising a bipolar substrate bias voltage supply configured to generate positive bias periods in which the substrate is biased positively with respect to ground and negative bias periods in which the substrate is biased negatively with respect to ground, the positive, the timing circuit configured to align the positive bias periods and negative bias periods to overlap with the first voltage pulses.

7. The system of claim 1, the first chamber further comprising a first inlet to supply gas to the first chamber; and the second chamber comprising a second inlet different from the first inlet to supply gas to the second chamber.

8. The system of claim 7, the first gas comprising an inert gas and the second comprising a condensing species.

9. The system of claim 7, the first gas comprising a condensing species and the second gas comprising an inert gas.

10. The system of claim 1, the first voltage pulses comprising having a frequency greater than 1 KHz.

11. The system of claim 1, the first voltage pulses comprising voltage pulses having a voltage between 100 V and 20 kV; and the second voltage pulses comprising voltage pulses having a voltage whose absolute value is less than 2 kV.

* * * * *